(12) United States Patent
Nakamura et al.

(10) Patent No.: US 7,892,914 B2
(45) Date of Patent: Feb. 22, 2011

(54) SEMICONDUCTOR DEVICE AND MANUFACTURING METHOD THEREOF

(75) Inventors: Genji Nakamura, Nirasaki (JP); Yasushi Akasaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 910 days.

(21) Appl. No.: 11/673,218

(22) Filed: Feb. 9, 2007

(65) Prior Publication Data

US 2007/0190767 A1 Aug. 16, 2007

(30) Foreign Application Priority Data

Feb. 10, 2006 (JP) ............................. 2006-033802

(51) Int. Cl.
*H01L 21/8238* (2006.01)
(52) U.S. Cl. ................ 438/228; 438/592; 257/E21.637
(58) Field of Classification Search ................ 438/223, 438/225, 228, 592; 257/E21.637
See application file for complete search history.

(56) References Cited

U.S. PATENT DOCUMENTS

| | | | |
|---|---|---|---|
| 6,642,094 B2 | 11/2003 | Rotondaro et al. | |
| 6,794,252 B2 | 9/2004 | Rotondaro et al. | |
| 6,881,631 B2 * | 4/2005 | Saito et al. | 438/283 |
| 2005/0145943 A1 | 7/2005 | Schram et al. | |

FOREIGN PATENT DOCUMENTS

JP 2004-356168 12/2004

OTHER PUBLICATIONS

S. B. Samavedam, et al., "Dual-Metal Gate CMOS with HfO$_2$ Gate Dielectric", 2002 IEEE, 4 pages.
Masayuki Terai, et al., "Highly Reliable HfSiON CMOSFET with Phase Controlled NiSi (NFET) and Ni$_3$Si (PFET) FUSI Gate Electrode", Symposium on VLSI Technology Digest of Technical Papers, 2005, pp. 68-69.

* cited by examiner

*Primary Examiner*—Chandra Chaudhari
(74) *Attorney, Agent, or Firm*—Oblon, Spivak, McClelland, Maier & Neustadt, L.L.P.

(57) ABSTRACT

In a method for manufacturing a semiconductor device, an insulating film is formed on an entire surface of a substrate having a device isolation region and a first and a second conductive region. Then, a semiconductor device structure having a gate electrode forming region is formed on each of the conductive regions, the insulating film being disposed between the gate electrode forming region and each of the conductive regions. A gate electrode groove is formed in the gate electrode forming region of the semiconductor device structure, the insulating film being removed in the gate electrode groove. Thereafter, a gate insulating film and a film of metal gate electrode material are deposited on a bottom surface and a side surface of the gate electrode groove and an alloy is formed by alloying the film of metal gate electrode material deposited in a gate electrode groove of the first conductive region.

20 Claims, 9 Drawing Sheets

SEMICONDUCTOR DEVICE AND MANUFACTURING METHOD THEREOF

FIELD OF THE INVENTION

The present invention relates to a semiconductor device; and, more particularly, to a CMISFET (Complementary Metal Insulator Semiconductor Field Effect Transistor) having an n-type and a p-type MISFET region, each having a metal gate electrode, and a manufacturing method thereof.

BACKGROUND OF THE INVENTION

Recently, a high-performance CMISFET, which includes an n-type and a p-type MISFET metal gate electrode having different work functions, has been gaining attention. For example, Article 1 (Samavedam et al., IDEM Tech. Dig., (2002) p. 443) discloses a technique of manufacturing a CMISFET, wherein by forming a TiN film for the p-type MISFET electrode throughout the entire surface of a wafer; removing the TiN film from the n-type MISFET region; and then depositing a TaSiN and a poly silicon film, the CMISFET is made to include a p-type MISFET region having a TiN electrode and an n-type MISFET region having a TaSiN electrode. Moreover, Article 2 (Terai et al. VLSI Symp. Tech. Dig., (2005) p. 68) discloses a technique of manufacturing a CMISFET in which an n-type MISFET has a metal gate electrode made of NiSi and a p-type MISFET has a metal gate electrode made of $Ni_3Si$.

However, in the technique disclosed in Article 1, since the TiN film formed in the n-type MISFET region needs to be removed during the manufacturing process, a gate insulating film residing below the TiN film may be subject to damage. Further, in Article 2, an HfSiON film is used as a gate insulating film, and a flat band voltage difference (relating to a work function difference) between the n-type MISFET having the NiSi metal gate electrode and the p-type MISFET having the $Ni_3Si$ metal gate electrode is as small as 0.25 V, thereby making the technique impractical.

Meanwhile, Japanese Patent Laid-Open Application No. 2002-217313 (hereinafter, referred to as "Patent Document 1") discloses a technique of manufacturing a CMISFET. In Patent Document 1, a cobalt layer and a silicon layer are sequentially formed on a gate dielectric layer and then parts of the silicon layer are removed. Thereafter, the resultant structure is heat-treated to locally form silicide, leaving cobalt silicide portions and cobalt portions both serving as gate electrodes. Thereafter, by performing further device forming processes, the CMISFET including n-type MISFET regions having cobalt silicide gate electrodes and p-type MISFET regions having cobalt gate electrodes are fabricated. In this technique, since it is not required to remove a layer that has been directly formed on the gate insulating film, the gate insulating film is prevented from being damaged. Further, relatively large theoretical work function difference can be obtained in the n-type MISFET and the p-type MISFET.

However, upon reviewing by the inventors of the present invention, the technique of Patent Document 1 proves to be hardly a practical one. To be specific, after forming the cobalt silicide and the cobalt portions to be functioned as gate electrodes, further processes for forming, e.g., source electrodes, drain electrodes and the like are performed. As a result, the gate electrodes experience relatively high temperatures, which reduces the work function difference between the gate electrodes.

As discussed above, despite the demand to obtain a technique capable of achieving a practical level of a work function difference between gate electrodes of an n-type and a p-type MISFET region without causing damages on an underlying gate insulating film, no such technique has been realized.

SUMMARY OF THE INVENTION

It is, therefore, an object of the present invention to provide a CMISFET semiconductor device and a manufacturing method therefor, capable of achieving a practical level of a work function difference between gate electrodes of two conductive regions without causing damages on an underlying gate insulating film.

In accordance with a first aspect of the invention, there is provided a method for manufacturing a semiconductor device, including the steps of: forming an insulating film on an entire surface of a substrate having a device isolation region and a first and a second conductive region; forming a semiconductor device structure having a gate electrode forming region on each of the conductive regions, the insulating film being disposed between the gate electrode forming region and each of the conductive regions; forming a gate electrode groove in the gate electrode forming region of the semiconductor device structure, wherein the insulating film is removed in the gate electrode groove; depositing a gate insulating film and a film of metal gate electrode material on a bottom surface and a side surface of the gate electrode groove; and forming an alloy by alloying the film of metal gate electrode material deposited in a gate electrode groove of the first conductive region.

In the first aspect of the present invention, the step of forming the alloy may include the steps of: depositing a reaction prevention film on the film of metal gate electrode material; removing the reaction prevention film of the first conductive region by etching; and then forming the alloy by depositing an alloy forming material film and then performing a heat treatment. Alternatively, the step of forming the alloy may include the steps of: depositing an alloy forming material film on the film of metal gate electrode material at a temperature at which the alloy forming material film is substantially unreacted with the film of metal gate electrode material; removing the alloy forming material film of the second conductive region by etching; and forming an alloy by performing the heat treatment. In this case, as for the reaction prevention film, a silicon oxide film may be used. Further, as for the alloy forming material film, a silicon film may be used.

In accordance with a second aspect of the invention, there is provided a method for manufacturing a semiconductor device, including the steps of: forming an insulating film on an entire surface of a substrate having a device isolation region and a first and a second conductive region; forming a semiconductor device structure having a gate electrode forming region on each of the conductive regions, the insulating film being disposed between the gate electrode forming region and each of the conductive regions; forming a gate electrode groove in the gate electrode forming region of the semiconductor device structure, wherein the insulating film is removed in the gate electrode groove; depositing a gate insulating film and a film of metal gate electrode material on a bottom surface and a side surface of the gate electrode groove; forming a first alloy by alloying the film of metal gate electrode material deposited in a gate electrode groove of the first conductive region; and forming a second alloy different from the first alloy by alloying the film of metal gate electrode material deposited in a gate electrode groove of the second conductive region.

In the second aspect of the present invention, the step of forming the first alloy may include the steps of: depositing a reaction prevention film on the film of metal gate electrode material; removing the reaction prevention film of the first conductive region by etching; and then forming the first alloy by depositing a first alloy forming material film and then performing a heat treatment. Alternatively, the step of forming the first alloy may include the steps of: depositing a first alloy forming material film on the film of metal gate electrode material at a temperature at which the first alloy forming material film is substantially unreacted with the film of metal gate electrode material; removing the first alloy forming material film of the second conductive region by etching; and forming the first alloy by performing a heat treatment.

The step of forming the second alloy may include the steps of: depositing, after the step of forming the first alloy, a reaction prevention film on the entire surface; removing the reaction prevention film of the second conductive region by etching; and forming the second alloy by depositing a second alloy forming material film and then performing a heat treatment. Alternatively, the step of forming the second alloy may include the steps of: depositing, after the step of forming the first alloy, a second alloy forming material film at a temperature at which the second alloy forming material film is substantially unreacted with the film of metal gate electrode material; removing the second alloy forming material film of the first conductive region by etching; and forming the second alloy by performing a heat treatment.

In the second aspect of the present invention, the second alloy is preferably a germanide or a carbide. Further, the first alloy is preferably a silicide.

In the first and the second aspect of the present invention, the first conductive region is preferably an n-type MISFET region. As for the gate insulating film, it is preferable to deposit an oxide containing any one of Hf, Zr, Y and Ln. As for the metal gate electrode material, there may be used a transition metal of the group VIII of the periodic table or a metal material having a Fermi level close to a lowest conduction band off the center of a Si forbidden band. Further, the gate electrode forming region may correspond to a dummy gate electrode formed on each of the conductive regions during the step of forming the semiconductor device structure and the gate electrode groove may be formed by removing the dummy gate electrode and the insulating film thereunder after forming a source/drain region.

In accordance with a third aspect of the invention, there is provided a CMISFET semiconductor device including: an n-type and a p-type MISFET region formed at a main surface region of a semiconductor substrate, wherein a gate electrode of the p-type MISFET region includes a germanide or a carbide, and a gate electrode of the n-type MISFET region includes a silicide.

In the third aspect of the present invention, it is preferable that the gate electrodes of the p-type and the n-type MISFET region include a transition metal of the group VIII of the periodic table.

In accordance with the first aspect of the present invention, the gate electrodes are formed in the first and the second conductive region by performing the steps of: forming an insulating film on an entire surface of a substrate having a device isolation region and the first and the second conductive region; forming a semiconductor device structure having a gate electrode forming region on each of the conductive regions, the insulating film being disposed between the gate electrode forming region and each of the conductive regions; forming a gate electrode groove in the gate electrode forming region of the semiconductor device structure, wherein the insulating film is removed in the gate electrode groove; depositing a gate insulating film and a film of metal gate electrode material on a bottom and a side surface of the gate electrode groove; and forming an alloy by alloying the film of metal gate electrode material deposited in a gate insulating groove of the first conductive region.

As a consequence, the absence of removing the film that has been directly contacted with the gate insulating film makes it possible to prevent the gate insulating film from being damaged effectively. Further, the gate electrodes are formed after forming, in the first and the second conductive region, the gate electrode forming regions and device elements other than the gate electrodes, such as the source/drain regions, the extensions and the like. Therefore, thermal damages of the gate electrodes can be reduced and, also, a deterioration of the work function difference between the two gate electrodes can be suppressed effectively. Moreover, the combination of the alloy gate electrode and the metal gate electrode can in principle increase a work function difference, so that it is possible to make the work function difference between the gate electrodes of the two conductive regions have a practical level.

Further, in accordance with the second aspect of the present invention, there are provided the steps of: forming an insulating film on an entire surface of a substrate having a device isolation region and a first and a second conductive region; forming a semiconductor device structure having a gate electrode forming region on each of the conducive regions, the insulating film being disposed between the gate electrode forming region and each of the conductive regions; forming a gate electrode groove in the gate electrode forming region of the semiconductor device structure, wherein the insulating film is removed in the gate electrode groove; depositing a gate insulating film and a film of metal gate electrode material on a bottom and a side surface of the gate electrode groove; forming a first alloy by alloying the film of metal gate electrode material disposed in a gate electrode groove of the first conductive region; and forming a second alloy different from the first alloy by alloying the film of metal gate electrode material disposed in a gate electrode groove of the second conductive region.

Consequently, the absence of process of removing the film that has been directly contacted with the gate insulating film makes it possible to prevent damages to the gate insulating film effectively, as in the first embodiment. Further, the gate electrodes are formed after forming, in the first and the second conductive region, the gate electrode forming regions and device elements other than the gate electrodes, such as the source and drain electrodes. Therefore, thermal damages of the gate electrodes can be reduced and, also, a deterioration of the work function difference between the two gate electrodes can be suppressed effectively. Moreover, the combination of the alloy gate electrodes can in principle increase a work function difference, so that it is possible to make the work function difference between the gate electrodes of the two conductive regions have a practical level.

Especially, the combination of a germanide or a carbide gate electrode in one conductive region and a silicide gate electrode in the other conductive region, which is a novel set of gate electrode materials which has not been employed conventionally, allows to implement a practical CMISFET having a large work function difference between the gate electrodes.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE EMBODIMENTS

Hereinafter, embodiments of the present invention will be described with reference to the accompanying drawings.

First Embodiment

A first embodiment of the present invention will be described, first.

FIGS. 1 to 11 show cross sectional views to explain a series of processes of a method in accordance with the first embodiment of the present invention.

Figure 1:
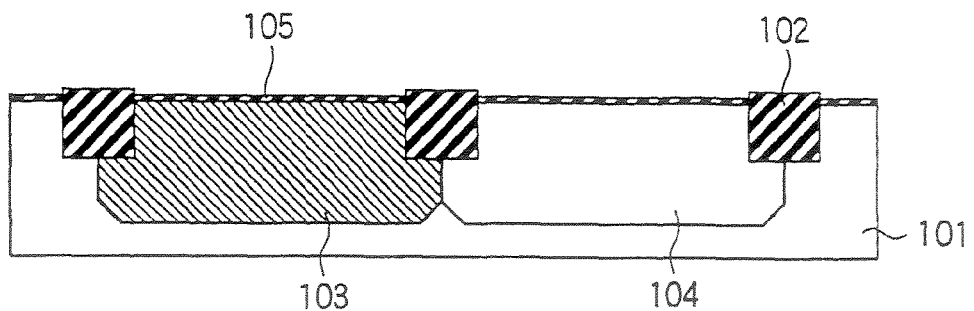
FIG. 1 is a cross sectional view to explain a method in accordance with a first embodiment of the present invention.

First, device isolation regions 102, a p-type well 103 that will be an n-type MISFET region, an n-type well 104 that will be a p-type MISFET region and a silicon oxide film 105 are formed at the surface region of a semiconductor substrate 101 mainly formed of silicon, as illustrated in FIG. 1.

Figure 2:
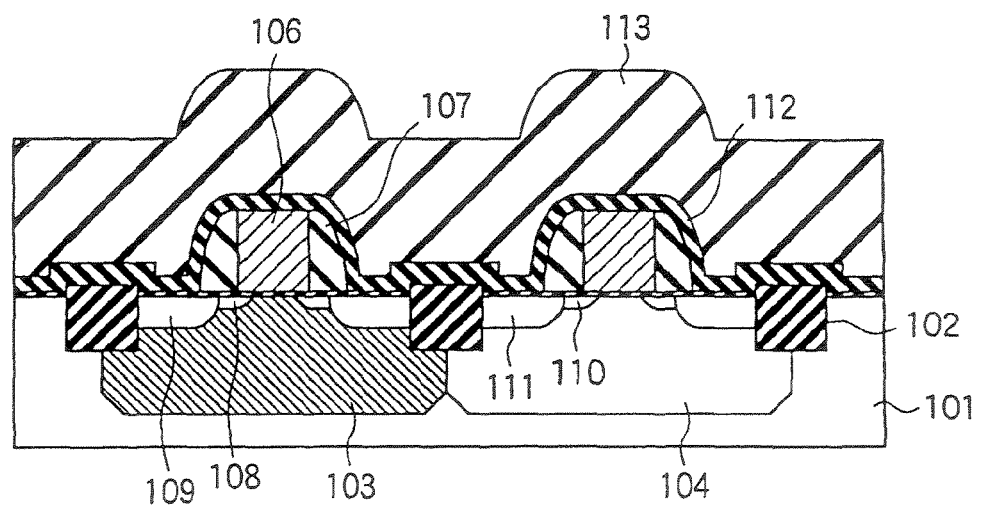
FIG. 2 shows a cross sectional view to explain the method in accordance with the first embodiment of the present invention.

Next, as shown in FIG. 2, dummy gate electrodes 106 made of polycrystalline silicon or the like, gate sidewalls 107 made of an insulating film such as a silicon nitride film or the like, extensions 108 of the n-type MISFET, a source/drain regions 109 of the n-type MISFET, extensions 110 of the p-type MISFET, source/drain regions 111 of the p-type MISFET, a silicon nitride film 112 serving as a contact etching stopper and an interlayer insulating film 113 are formed by using a known technique for forming a polycrystalline silicon gate transistor. As described above, the device elements other than the gate electrodes are formed before forming the gate electrodes.

Figure 3:
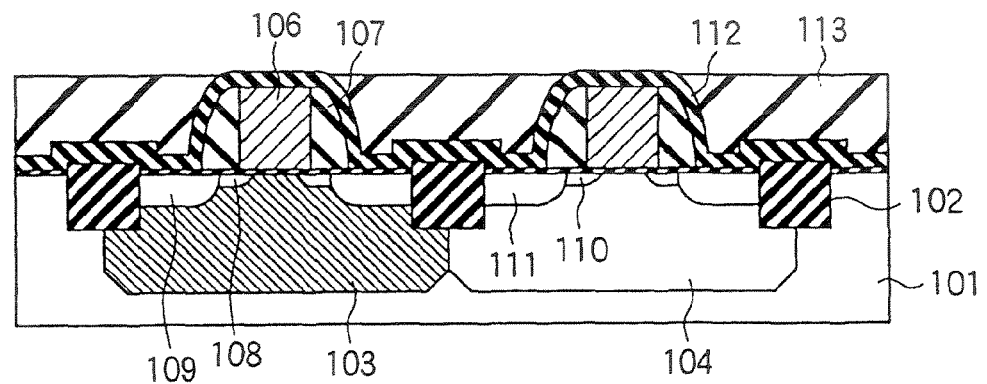
FIG. 3 provides a cross sectional view to explain the method in accordance with the first embodiment of the present invention.

Next, as depicted in FIG. 3, top surfaces of the silicon nitride film 112 deposited on top of the dummy gate electrodes 106 are exposed by polishing the interlayer insulating film 113 through a CMP process.

Figure 4:
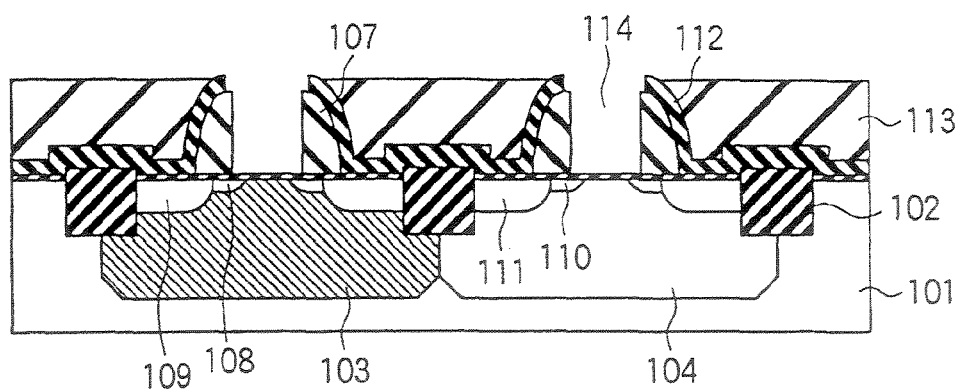
FIG. 4 illustrates a cross sectional view to explain the method in accordance with the first embodiment of the present invention.
Figure 5:
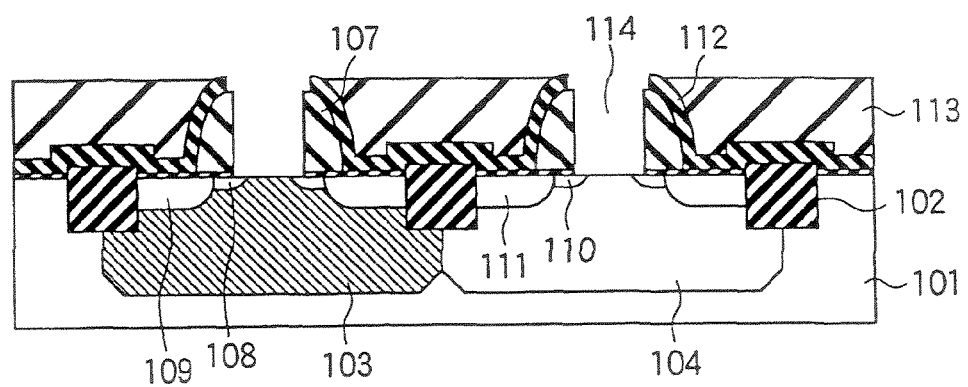
FIG. 5 describes a cross sectional view to explain the method in accordance with the first embodiment of the present invention.

Then, as described in FIG. 4, grooves 114 that will be gate electrode forming regions are formed by selectively removing exposed portions of the silicon nitride film 112 and the dummy gate electrodes 106 by an RIE method or the like. Next, the exposed portions of the silicon oxide film 105 that have been disposed under the dummy gate electrodes 106 are removed by etching with an HF solution or the like, as illustrated in FIG. 5.

Figure 6:
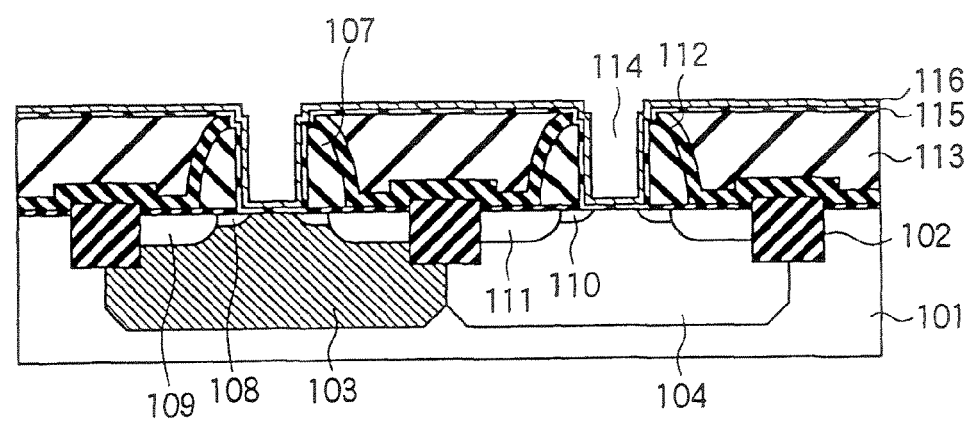
FIG. 6 depicts a cross sectional view to explain the method in accordance with the first embodiment of the present invention.

Thereafter, a gate insulating film 115 and a metal gate electrode material film 116 are sequentially deposited, as can be seen from FIG. 6. As for the gate insulating film 115, it is preferable to deposit a high-k insulating film of ionic crystals containing one or more elements selected from the group consisting of Hf (hafnium), Zr (zirconium), Y (yttrium) and Ln (lanthanoid), and it is also preferable to deposit an $SiO_2$ film or an SiON film. As for a metal material forming the metal gate electrode material film 116, it is preferable to use a metal of the group VIII in the periodic table, such as Pt, Co, Ni, Ir, Ru or the like, and it is also possible to use a conductive metal oxide having a Fermi level close to a lowest conduction band off the center of the Si forbidden band.

Figure 7:
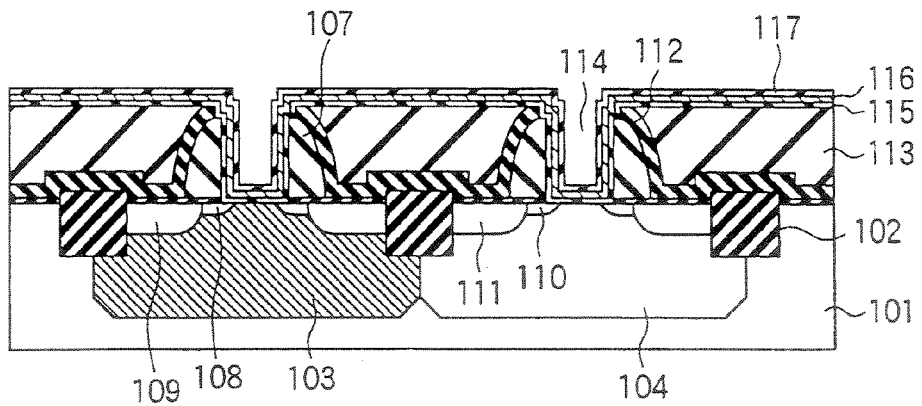
FIG. 7 presents a cross sectional view to explain the method in accordance with the first embodiment of the present invention.

As shown in FIG. 7, a reaction prevention film 117 formed of a silicon oxide film, for example, is then deposited on the metal gate electrode material film 116. As for the reaction prevention film 117, a silicon nitride film may also be used.

Figure 8:
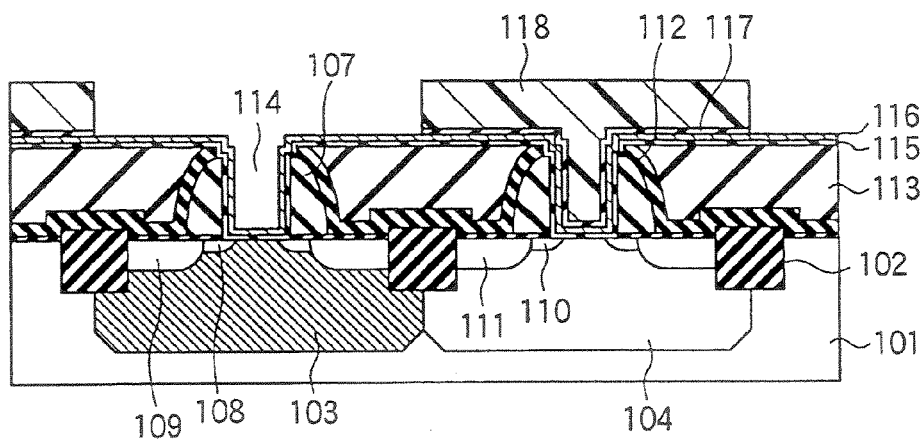
FIG. 8 represents a cross sectional view to explain the method in accordance with the first embodiment of the present invention.

Next, as illustrated in FIG. 8, an etching mask 118 such as a photoresist or the like is formed on the p-type MISFET region and, then, the reaction prevention film 117 deposited on the n-type MISFET region is removed by etching through the RIE method.

Figure 9:
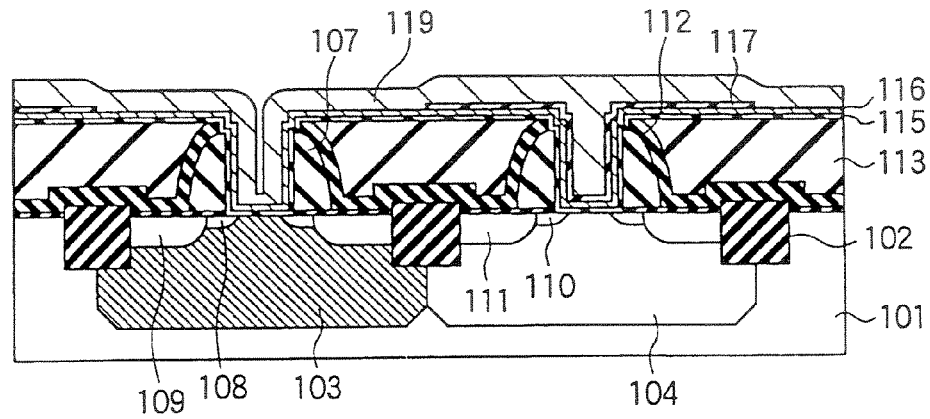
FIG. 9 offers a cross sectional view to explain the method in accordance with the first embodiment of the present invention.
Figure 10:
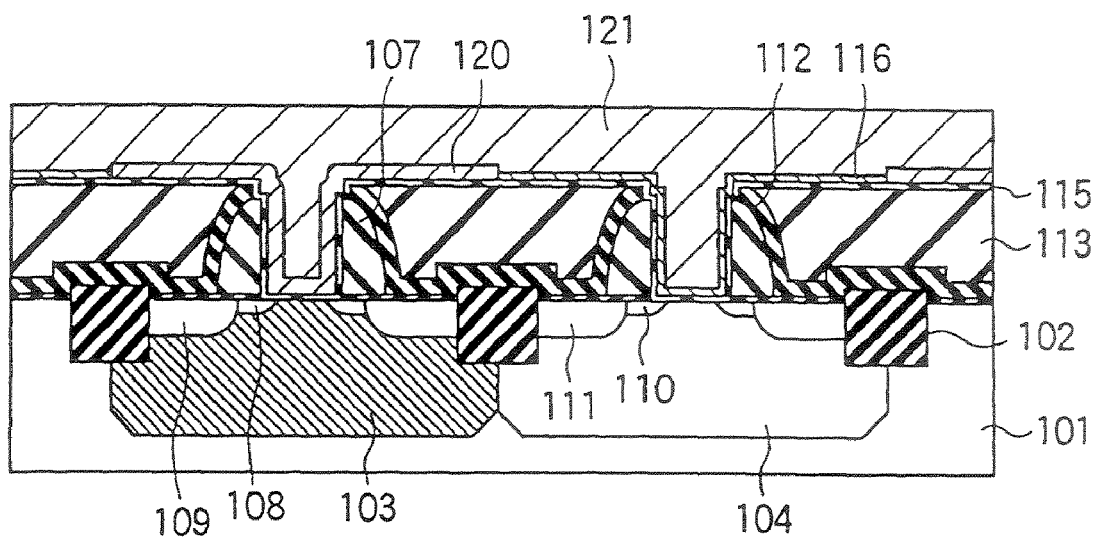
FIG. 10 shows a cross sectional view to explain the method in accordance with the first embodiment of the present invention.

Subsequently as shown in FIG. 9, the etching mask 118 formed in the p-type MISFET region is removed and, then, a silicon film 119 is deposited as an alloy forming material film on the entire surface. Then, by performing the heat treatment, only the metal gate electrode material film 116 of the n-type MISFET region reacts with the silicon film 119. Accordingly, an alloy forming reaction (silicide forming reaction) takes place to generate a silicide film 120 only on the n-type MISFET region, as depicted in FIG. 10. Next, the remaining silicon film 119 and the reaction prevention film 117 are removed by using the RIE method or the like and, then, a metal film 121 having a low resistivity, such as W or the like, is deposited.

Figure 11:
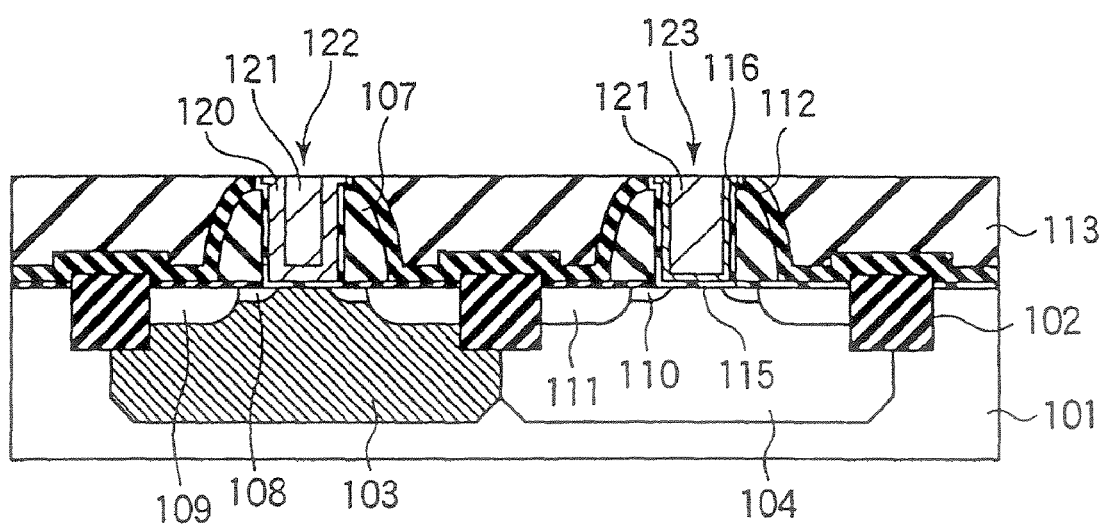
FIG. 11 depicts a cross sectional view to explain the method in accordance with the first embodiment of the present invention.

Finally, as shown in FIG. 11, the gate insulating film 115, the metal gate electrode material film 116, the silicide film 120 and the metal film 121, all being deposited outside the grooves 114, are removed by the CMP process. As a result, the groove 114 of the n-type MISFET region serves as a first gate electrode 122 having the silicide film 120, whereas the groove 114 of the p-type MISFET region serves as a second gate electrode 123 having the metal gate electrode material film 116.

Thereafter, the fabrication of the CMISFET is completed by forming interlayer insulating films, contact holes and wirings with the use of a known method.

In accordance with this embodiment, the absence of process of removing the film that has been formed directly on the gate insulating film 115, leads to an accomplishment of a CMIFSFET having an n-type MISFET gate electrode made of silicide and a p-type MISFFET gate electrode made of metal without inflicting damages on the gate insulating film 115. A work function difference between the silicide and the metal material constituting the silicide is relatively large and, also, such a large work function difference to be described later can be maintained because the gate electrodes are hardly affected by the heat by forming the gate electrodes after forming other device elements such as source/drain regions and the like.

Hence, a CMISFET having a practical work function difference can be realized, as will be described later. Especially, in case a high-k oxide film containing Hf or Zr is used as a gate insulating film and the n-type MISFET metal gate electrode is made of a metal material containing Si such as silicide or the like, there occurs a Fermi level pinning phenomenon (threshold shift caused by a metal-Si bonding at the interface between the gate electrodes and the gate insulating film), which leads to a relatively low threshold voltage. Further, since the metal material forming the gate electrode of the p-type MISFET region is masked by a silicon oxide film serving as a reaction prevention film, it is possible to prevent silicidation in the p-type MISFET region where silicon has been deposited.

Figure 12:
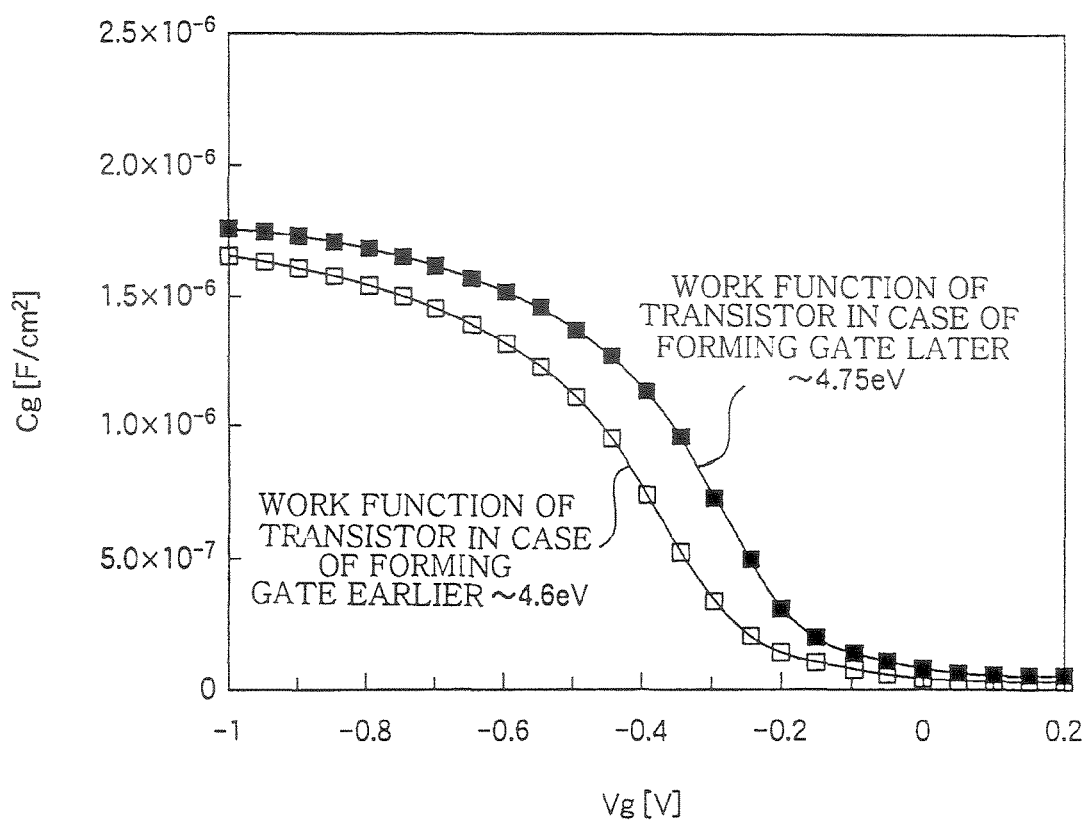
FIG. 12 is a diagram of comparing CV characteristics of metal gate electrodes between the cases of forming the metal gate electrodes earlier and later.

Although there has been known the technique of forming the gate electrodes after forming other device elements such as source/drain regions and the like, it has not been recognized that such a technique can suppress a decrease of the work function difference between the n-type MISFET and the p-type MISFET in the CMISFET. Under the circumstances, the inventors of the present invention have measured the work functions by investigating CV characteristics of the p-type MISFET metal gate electrode having a larger work function for the cases of forming the gate electrode earlier as in prior art and forming the same later. The result thereof is shown in FIG. 12. Herein, Ru was used as the gate electrode. As clearly can be seen from FIG. 12, a larger work function difference can be obtained when forming the gate electrodes later as in this embodiment than when forming same earlier. This is because when the metal gate electrodes are formed later, it is possible to prevent heat generated by forming device elements other than the gate electrodes from being applied to the gate electrodes.

In this embodiment, a combination of PtSi and Pt, that of NiSi and Ni, or the like may be exemplified as combination of materials constituting the n-type and p-type MISFET gate electrodes. In case of the former combination, PtSi of the n-type MISFET has a work function of about 4.6 eV, and Pt of the p-type MISFET has a work function of about 5.2 eV, which results in a work function difference of about 0.6 eV. In case of the latter combination, NiSi of the n-type MISFET has a work function of about 4.4 eV, and Ni of the p-type MISFET has a work function of about 5.2 eV, which results in a work function difference of about 0.8 eV. Such values are close a practical level.

Although the n-type MISFET gate electrode is made of silicide in the aforementioned embodiment, another alloy other than silicide may be used.

Second Embodiment

Hereinafter, a second embodiment of the present invention will be described.

Figure 13:
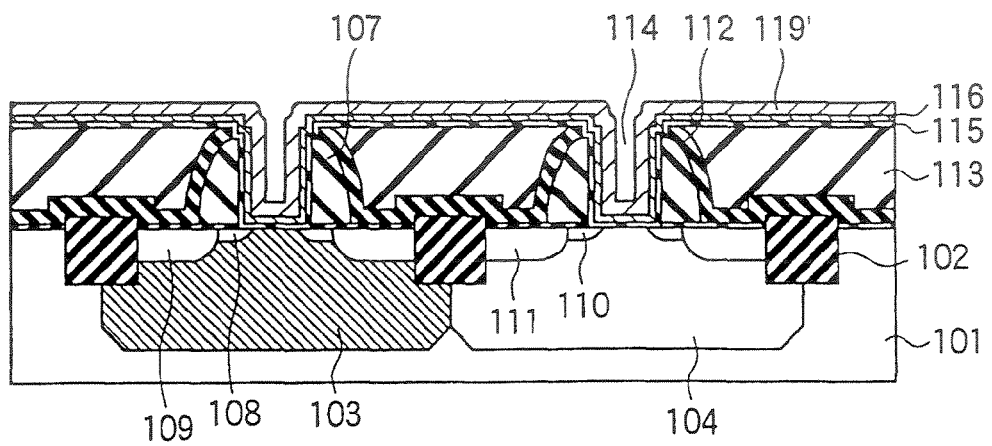
FIG. 13 illustrates a cross sectional view to explain a method in accordance with a second embodiment of the present invention.

FIGS. 13 to 17 present cross sectional views to explain a series of processes of a method in accordance with the second embodiment of the present invention. In this embodiment, the processes illustrated in FIGS. 1 to 6 of the first embodiment are equally performed first. As for the gate insulating film 115 and the metal gate electrode material film 116, the same films used in the first embodiment may be employed. Next, a silicon film 119' is deposited on the metal gate electrode material film 116, as shown in FIG. 13. In this case, the silicon film 119' is deposited by using a film forming method enabling a low temperature deposition, e.g., a sputtering method or the like, to thereby prevent the silicide from being formed in the p-type MISFET region.

Figure 14:
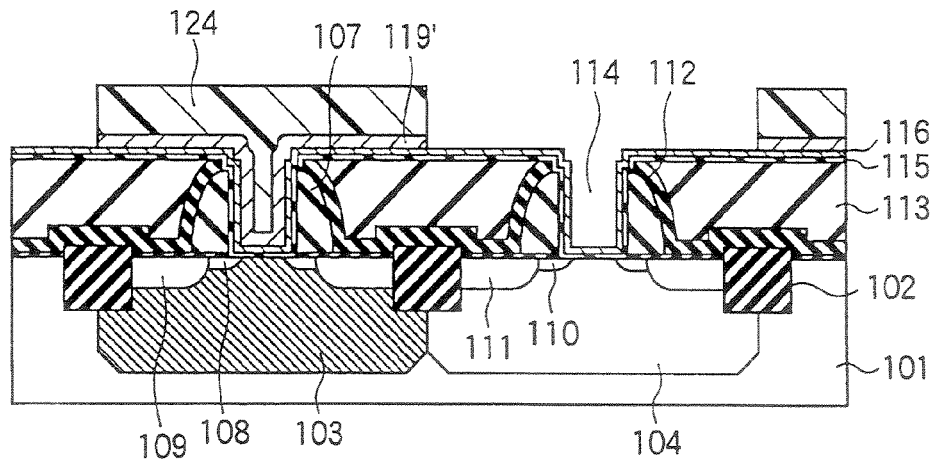
FIG. 14 presents a cross sectional view to explain the method in accordance with the second embodiment of the present invention.
Figure 15:
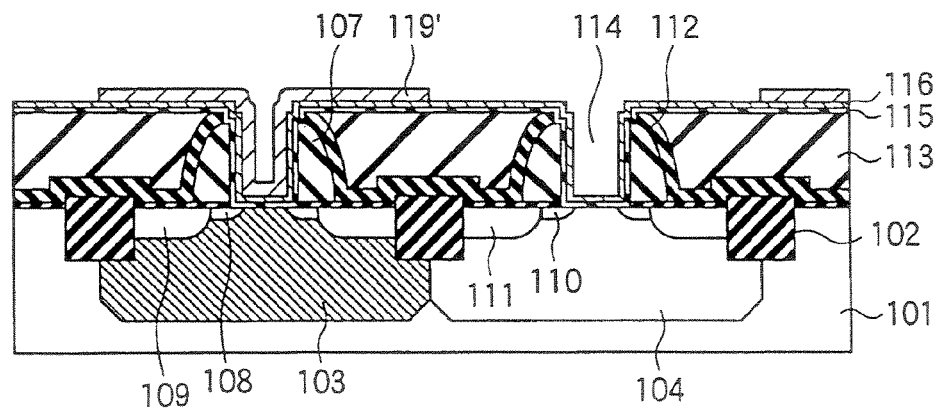
FIG. 15 represents a cross sectional view to explain the method in accordance with the second embodiment of the present invention.

Next, as illustrated in FIG. 14, an etching mask 124 such as a photoresist or the like is formed on the n-type MISFET region and, then, the silicon film 119' deposited on the p-type MISFET region is removed by etching using the RIE method. Thereafter, the etching mask 124 is removed as shown in FIG. 15.

Figure 16:
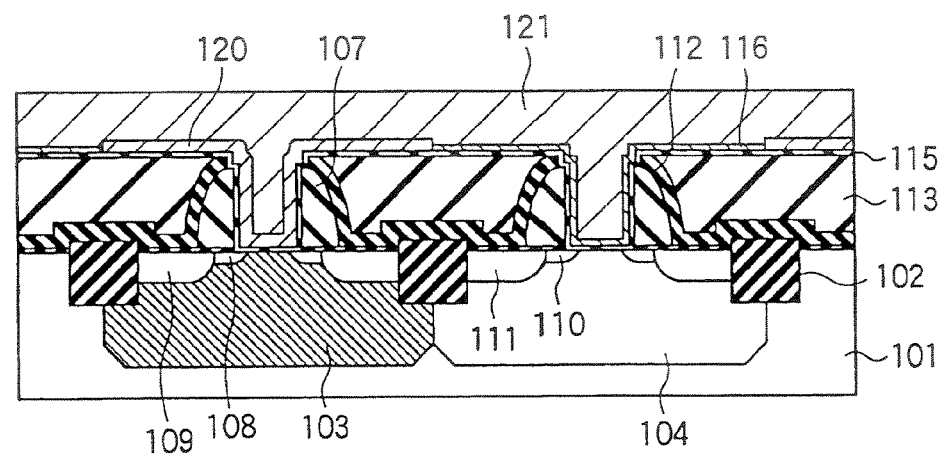
FIG. 16 provides a cross sectional view to explain the method in accordance with the second embodiment of the present invention.
Figure 17:
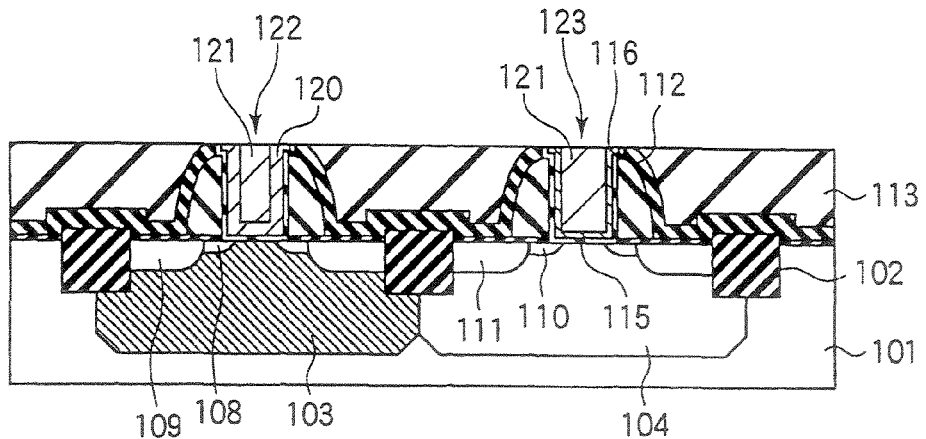
FIG. 17 offers a cross sectional view to explain the method in accordance with the second embodiment of the present invention.

Then, by performing the heat treatment, only the metal gate electrode material film 116 of the n-type MISFET region reacts with the silicon film 119'. Accordingly, an alloy forming reaction (silicide forming reaction) takes place to generate a silicide film 120 only in the n-type MISFET region, as depicted in FIG. 16. Next, a metal film 121 having a low resistivity, such as W or the like, is deposited, which results in the same structure shown in FIG. 10 of the first embodiment. As in the process depicted in FIG. 11 of the first embodiment, the gate insulating film 115, the metal gate electrode material film 116, the silicide film 120 and the metal film 121, all being deposited outside the groves 114, are removed by using the CMP process. As a consequence, the groove 114 of the n-type MISFET region serves as a first gate electrode 112 having the silicide film 120, whereas the groove 114 of the p-type MISFET region serves as a second electrode 123 having the metal gate electrode material film 116 (see FIG. 17).

Thereafter, a fabrication of the CMISFET is completed by forming interlayer insulating films, contact holes and wirings with the use of a known method as in the first embodiment.

In this embodiment, there exists no such process of removing the film that has been directly formed on the gate insulating film 115 as in the first embodiment. Therefore, it is possible to fabricate the CMISFET having a practical work function difference without causing damages on the gate insulating film 115 in view of materials and manufacturing processes of forming the gate electrodes later. Moreover, the n-type MISFET metal gate electrode is also made of metal containing Si in this embodiment. Therefore, if an oxide containing Hf or Zr is used as a gate insulating film, there occurs a Fermi level pinning phenomenon (threshold value shift caused by a Metal-Si bonding at the interface between the gate electrode and the gate insulating film), which leads to a relatively low threshold voltage.

Further, the reaction prevention film is not interposed between the metal gate electrode material film 116 and the silicon film 119' in this embodiment, so that the process can be simplified compared with the process of the first embodiment. In this case, however, the silicon film 119' is formed on the metal gate electrode material film 116 exposed at the p-type MISFET where silicide is not to be formed. Therefore, the silicon film 119' needs to be deposited at a low temperature at which the silicidation reaction does not take place.

Third Embodiment

Hereinafter, a third embodiment of the present invention will be described.

FIGS. 18 to 23 represent cross sectional views to explain a method in accordance with the third embodiment of the present invention. In this embodiment, the processes illustrated in FIGS. 1 to 6 of the first embodiment are equally performed. As for the gate insulating film 115 and the metal gate electrode material film 116, the same films used in the first embodiment may be used. Thereafter, the processes described in FIGS. 13 to 15 of the second embodiment are equally performed.

Figure 18:
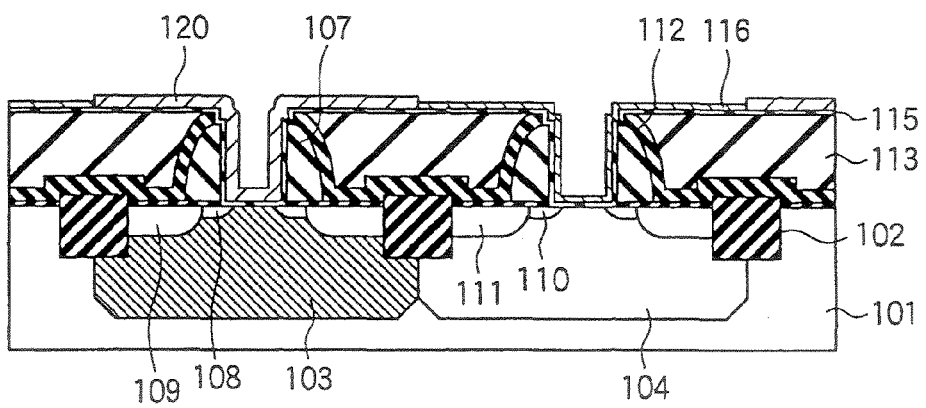
FIG. 18 describes a cross sectional view to explain a method in accordance with a third embodiment of the present invention.

Thereafter, by performing the heat treatment, only the metal gate electrode material film 116 of the n-type MISFET region reacts with the silicon film 119', and an alloy forming reaction (silicide forming reaction) takes place, which generates a silicide film 120, as shown in FIG. 18.

Figure 19:
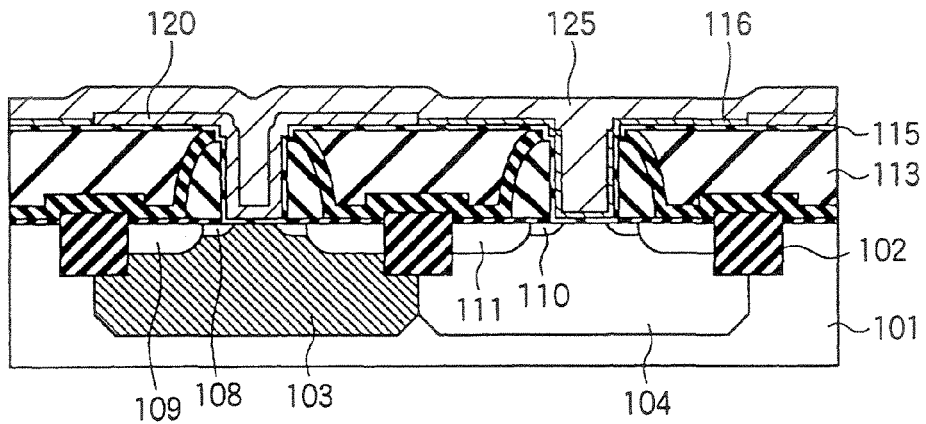
FIG. 19 shows a cross sectional view to explain the method in accordance with the third embodiment of the present invention.
Figure 20:
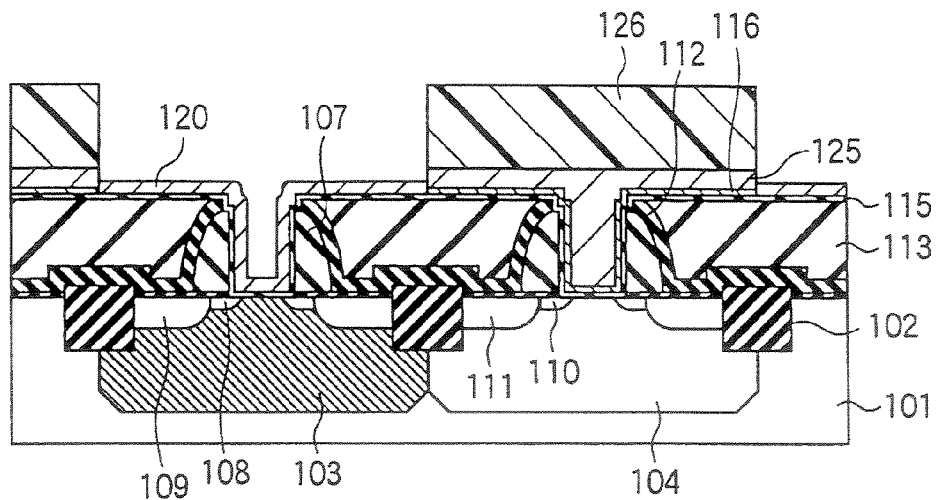
FIG. 20 depicts a cross sectional view to explain the method in accordance with the third embodiment of the present invention.

Next, a germanium film 125 is formed on an entire surface as depicted in FIG. 19. Thereafter, an etching mask 126 such as a photoresist or the like is formed on the p-type MISFET region and, then, the germanium film 125 deposited on the n-type MISFET region is removed as illustrated in FIG. 20.

Figure 21:
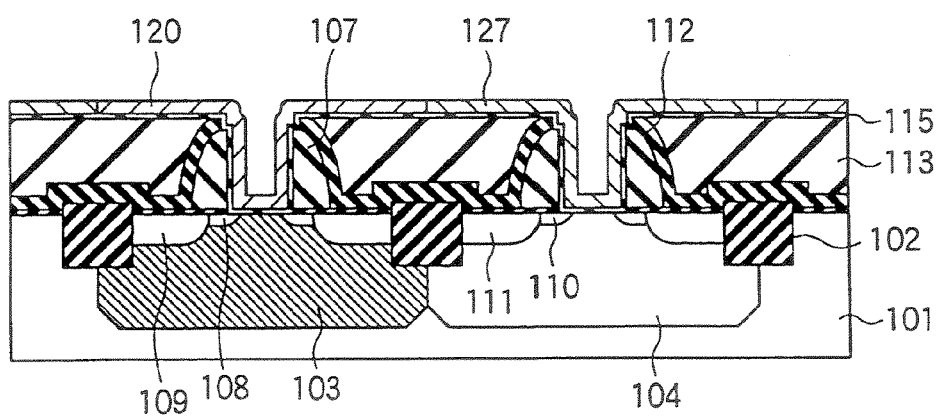
FIG. 21 illustrates a cross sectional view to explain the method in accordance with the third embodiment of the present invention.

Next, after removing the etching mask 126 as depicted in FIG. 21, the heat treatment is performed to make the metal gate electrode material film 116 remaining in the p-type MISFET region react with the germanium film 125. Consequently, an alloy forming reaction (germanide forming reaction) takes place, which generates a germanide film 127.

Figure 22:
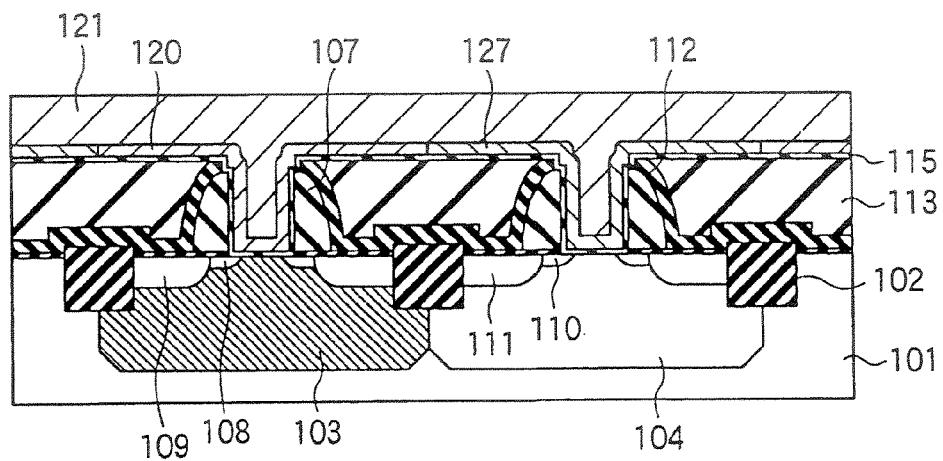
FIG. 22 provides a cross sectional view to explain the method in accordance with the third embodiment of the present invention.
Figure 23:
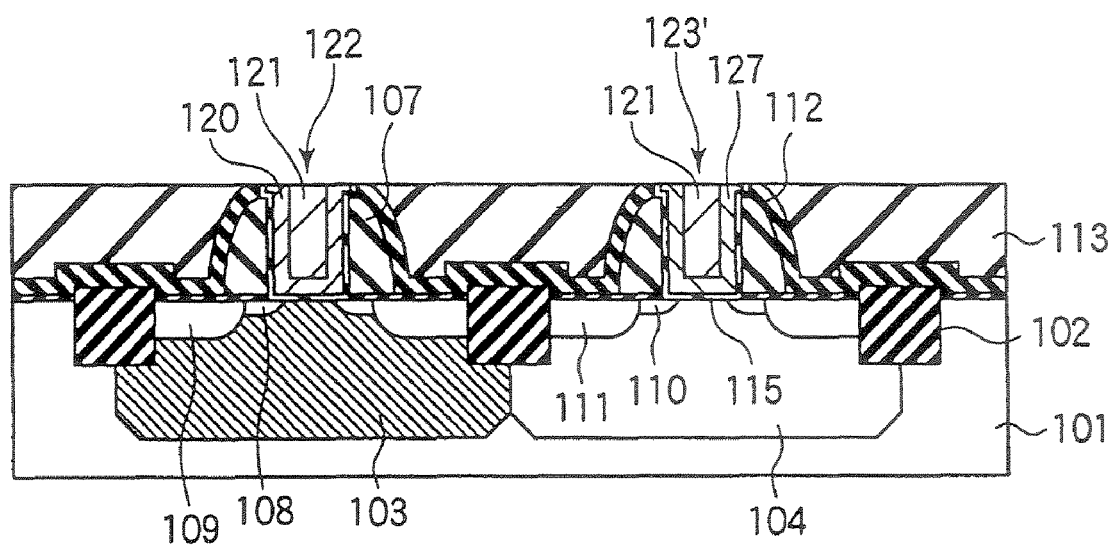
FIG. 23 is a cross sectional view to explain the method in accordance with the third embodiment of the present invention.

Next, as in the first and the second embodiment, the metal film 121 having a low resistivity, such as W or the like, is deposited as illustrated in FIG. 22. Thereafter, the gate insulating film 115, the silicide film 120, the germanide film 127 and the metal film 121, all being deposited outside the grooves 114, are removed by using the CMP process as illustrated in FIG. 23. As a result, the groove 114 of the n-type MISFET region serves as a first gate electrode 122 having the silicide film 120, whereas the groove 114 of the p-type MISFET region serves as a second gate electrode 123' having the germanide film 127.

Thereafter, a fabrication of the CMISFET is completed by forming interlayer insulating films, contact holes and wirings with the use of a known method as the first embodiment.

In this embodiment, the absence of a process of removing the film that has been formed directly on the gate insulating film 115 as in the first embodiment leads to a realization of the CMIFSFET having a practical work function difference without inflicting damages on the gate insulating film 115 in view of materials and manufacturing processes of forming the gate electrodes later. Moreover, since the n-type MISFET metal gate electrode is also made of metal containing Si in this embodiment, if an oxide containing Hf or Zr is used for the gate insulating film, there occurs a Fermi level pinning phenomenon (threshold value shift caused by a Metal-Si bonding at the interface between the gate electrode and the gate insulating film), which leads to a relatively low threshold voltage. Furthermore, a practical CMISFET can also be realized in this embodiment by using germanide as the p-type MISFET gate electrode. There has been no combination of the silicide and the germanide gate electrode in the prior art.

In this embodiment, a combination of NiSi and NiGe, that of PtSi and PtGe, or the like may be exemplified as a combination of materials constituting the n-type and p-type MISFET gate electrodes. In case of the former combination, NiSi of the n-type MISFET has a work function of about 4.4 eV, and NiGe of the p-type MISFET has a work function of about 5.0 eV, which results in a work function difference of about 0.6 eV. Such values close a practical level and, also, the substantially same level can be achieved in the latter combination.

In this embodiment, a reaction prevention film is not interposed between the metal gate electrode material film 116 and the silicon film 119' residing a region where the alloy forming reaction is not allowed and between the silicide film 120 and the germanium film 125. Therefore, when forming the silicon film 119' and the germanium film 125, they need to be deposited at a low temperature not allowing the silicide forming reaction and the germanide forming reaction to occur. In order to avoid any possibilities for those reactions to occur, it is preferable to form therebetween the reaction prevention film such as a silicon oxide film or the like as in the first embodiment.

As for a combination of the n-type MISFET gate electrode and the p-type MISFET gate electrode, there has been exemplified a combination of a silicide and a germanide in this embodiment. However, according to study of the inventors of the present invention, a carbide can also increase the work function compared with metal, so that a combination of the silicide and a carbide can also ensure a large work function difference, which leads to the realization of the practical CMISFET. In case the carbide is used as the p-type MISFET gate electrode, there may be employed a technique for forming a carbon film instead of the germanium film 125 in FIG. 19 and then converting it into the carbide by performing a heat treatment. As for an actual combination thereof, there may be exemplified a combination of RuSi for the n-type MISFET gate electrode and RuC for the p-type MISFET gate electrode.

Further, the present invention can be variously modified without being limited to the first to the third embodiments. For example, although the aforementioned embodiments have described the combination of silicide and metal, that of silicide and germanide and that of silicide and carbide, it is not limited thereto and there may be employed other alloy/metal or alloy/alloy combination having a large work function difference.

Furthermore, as for a technique of forming gate electrodes later, there has been described a self-align process using a damascene gate method in which gate electrodes are formed after forming other device elements by using dummy gate electrodes and then removing the dummy gate electrodes. However, the present invention is not limited thereto and can be equally used when forming gate electrodes later by using a method other than the self-align process.

The present invention can be appropriately applied to a high-performance CMISFET.

While the invention has been shown and described with respect to the preferred embodiment, it will be understood by those skilled in the art that various changes and modification may be made without departing from the scope of the invention as defined in the following claims.

What is claimed is:

1. A method for manufacturing a semiconductor device, comprising the steps of:
    forming an insulating film on an entire surface of a substrate having a device isolation region and a first and a second conductive region;
    forming a semiconductor device structure having a gate electrode forming region on each of the conductive regions, the insulating film being disposed between the gate electrode forming region and each of the conductive regions;
    forming a gate electrode groove in the gate electrode forming region of the semiconductor device structure, wherein the insulating film is removed in the gate electrode groove;
    depositing a gate insulating film and a film of metal gate electrode material on a bottom surface and a side surface of the gate electrode groove; and
    forming an alloy by alloying the film of metal gate electrode material deposited in a gate electrode groove of the first conductive region,
    wherein in the step of forming the alloy, an alloy forming material film is deposited on the film of metal gate electrode material, and the film of metal gate electrode material is alloyed with the alloy forming material film, and
    wherein the step of forming the alloy includes the steps of:
    depositing a reaction prevention film on the film of metal gate electrode material;
    removing the reaction prevention film of the first conductive region by etching; and then
    forming the alloy by depositing the alloy forming material film and then performing a heat treatment.

2. The method of claim 1, wherein the reaction prevention film is a silicon oxide film.

3. A method for manufacturing a semiconductor device, comprising the steps of:
    forming an insulating film on an entire surface of a substrate having a device isolation region and a first and a second conductive region;
    forming a semiconductor device structure having a gate electrode forming region on each of the conductive regions, the insulating film being disposed between the gate electrode forming region and each of the conductive regions;
    forming a gate electrode groove in the gate electrode forming region of the semiconductor device structure, wherein the insulating film is removed in the gate electrode groove;
    depositing a gate insulating film and a film of metal gate electrode material on a bottom surface and a side surface of the gate electrode groove; and
    forming an alloy by alloying the film of metal gate electrode material deposited in a gate electrode groove of the first conductive region,
    wherein in the step of forming the alloy, an alloy forming material film is deposited on the film of metal gate electrode material, and the film of metal gate electrode material is alloyed with the alloy forming material film, and
    wherein the step of forming the alloy includes the steps of:
    depositing an alloy forming material film on the film of metal gate electrode material at a temperature at which the alloy forming material film is substantially unreacted with the film of metal gate electrode material;
    removing the alloy forming material film of the second conductive region by etching; and then
    forming the alloy by performing a heat treatment.

4. A method for manufacturing a semiconductor device, comprising the steps of:
    forming an insulating film on an entire surface of a substrate having a device isolation region and a first and a second conductive region;
    forming a semiconductor device structure having a gate electrode forming region on each of the conductive regions, the insulating film being disposed between the gate electrode forming region and each of the conductive regions;
    forming a gate electrode groove in the gate electrode forming region of the semiconductor device structure, wherein the insulating film is removed in the gate electrode groove;
    depositing a gate insulating film and a film of metal gate electrode material on a bottom surface and a side surface of the gate electrode groove;
    forming a first alloy by alloying the film of metal gate electrode material disposed in a gate electrode groove of the first conductive region; and
    forming a second alloy different from the first alloy by alloying the film of metal gate electrode material disposed in a gate electrode groove of the second conductive region.

5. The method of claim 4, wherein the step of forming the first alloy includes the steps of:
    depositing a reaction prevention film on the film of metal gate electrode material;
    removing the reaction prevention film of the first conductive region by etching; and then
    forming the first alloy by depositing a first alloy forming material film and then performing a heat treatment.

6. The method of claim 5, wherein the reaction prevention film is a silicon oxide film.

7. The method of claim 4, wherein the step of forming the first alloy includes the steps of:
    depositing a first alloy forming material film on the film of metal gate electrode material at a temperature at which the first alloy forming material film is substantially unreacted with the film of metal gate electrode material;
    removing the first alloy forming material film of the second conductive region by etching; and
    forming the first alloy by performing a heat treatment.

8. The method of claim 4, wherein the step of forming the second alloy includes the steps of:
    depositing, after the step of forming the first alloy, a reaction prevention film on the entire surface;
    removing the reaction prevention film of the second conductive region by etching; and
    forming the second alloy by depositing a second alloy forming material film and then performing a heat treatment.

9. The method of claim 4, wherein the step of forming the second alloy includes the steps of:
    depositing, after the step of forming the first alloy, a second alloy forming material film at a temperature at which the second alloy forming material film is substantially unreacted with the film of metal gate electrode material;

removing the second alloy forming material film of the first conductive region by etching; and forming the second alloy by performing a heat treatment.

10. The method of claim 4, wherein the second alloy is a germanide or a carbide.

11. The method of claim 4, wherein the first alloy is silicide.

12. The method of claim 1, wherein the first conductive region is an n-type MISFET region.

13. The method of claim 1, wherein the gate insulating film is formed of an oxide containing any one of Hf, Zr, Y and Ln.

14. The method of claim 1, wherein the metal gate electrode material is a transition metal of the group VIII of the periodic table or has a Fermi level close to a lowest conduction band off the center of a Si forbidden band.

15. The method of claim 1, wherein the gate electrode forming region corresponds to a dummy gate electrode formed on each of the conductive regions during the step of forming the semiconductor device structure and the gate electrode groove is formed by removing the dummy gate electrode and the insulating film thereunder after forming a source/drain region.

16. The method of claim 1, wherein in the step of forming the alloy, the alloy is formed on and in direct contact with the gate insulating film.

17. The method of claim 3, wherein the first conductive region is an n-type MISFET region.

18. The method of claim 3, wherein the gate insulating film is formed of an oxide containing any one of Hf, Zr, Y and Ln.

19. The method of claim 3, wherein the metal gate electrode material is a transition metal of the group VIII of the periodic table or has a Fermi level close to a lowest conduction band off the center of a Si forbidden band.

20. The method of claim 3, wherein the gate electrode forming region corresponds to a dummy gate electrode formed on each of the conductive regions during the step of forming the semiconductor device structure and the gate electrode groove is formed by removing the dummy gate electrode and the insulating film thereunder after forming a source/drain region.

* * * * *